United States Patent
Lin et al.

(10) Patent No.: US 9,484,263 B1
(45) Date of Patent: Nov. 1, 2016

(54) METHOD OF REMOVING A HARD MASK ON A GATE

(71) Applicant: UNITED MICROELECTRONICS CORP., Hsin-Chu (TW)

(72) Inventors: Chao-Hung Lin, Changhua County (TW); Li-Wei Feng, Kaohsiung (TW); Shih-Hung Tsai, Tainan (TW); Jyh-Shyang Jenq, Pingtung County (TW); Ching-Ling Lin, Kaohsiung (TW); Yi-Wen Chen, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/926,003

(22) Filed: Oct. 29, 2015

(51) Int. Cl.
| | |
|---|---|
| *H01L 21/8234* | (2006.01) |
| *H01L 29/66* | (2006.01) |
| *H01L 21/3105* | (2006.01) |
| *H01L 21/02* | (2006.01) |
| *H01L 21/3213* | (2006.01) |
| *H01L 21/28* | (2006.01) |
| *H01L 29/06* | (2006.01) |
| *H01L 21/311* | (2006.01) |

(52) U.S. Cl.
CPC ... *H01L 21/823437* (2013.01); *H01L 21/0217* (2013.01); *H01L 21/02164* (2013.01); *H01L 21/28035* (2013.01); *H01L 21/31055* (2013.01); *H01L 21/31144* (2013.01); *H01L 21/32139* (2013.01); *H01L 21/823431* (2013.01); *H01L 21/823468* (2013.01); *H01L 29/0649* (2013.01); *H01L 29/6653* (2013.01)

(58) Field of Classification Search
CPC .................. H01L 21/823437; H01L 21/0217; H01L 21/31144; H01L 21/32139; H01L 21/31055; H01L 21/823468
See application file for complete search history.

(56) References Cited

U.S. PATENT DOCUMENTS

| | | | |
|---|---|---|---|
| 7,994,576 B2 * | 8/2011 | Tseng | .................. H01L 27/0629 257/350 |
| 8,507,336 B2 | 8/2013 | Jiang | |
| 8,673,755 B2 | 3/2014 | Chang | |
| 8,796,084 B2 | 8/2014 | Tsai | |
| 8,796,127 B2 | 8/2014 | Kim | |
| 2004/0266151 A1 | 12/2004 | Lim | |
| 2011/0156161 A1 * | 6/2011 | Tseng | .................. H01L 23/5256 257/379 |
| 2011/0312180 A1 * | 12/2011 | Wang | ................ H01L 21/31055 438/692 |
| 2012/0171854 A1 | 7/2012 | He | |
| 2013/0309856 A1 | 11/2013 | Jagannathan | |
| 2014/0159169 A1 | 6/2014 | Xie | |

OTHER PUBLICATIONS

Chen, Title of Invention: Method for Fabricating Semiconductor Device, U.S. Appl. No. 14/660,913, filed Mar. 17, 2015.

* cited by examiner

*Primary Examiner* — Michael Jung
(74) *Attorney, Agent, or Firm* — Winston Hsu; Scott Margo

(57) ABSTRACT

A method of removing a hard mask on a gate includes forming a first gate structure and a second gate structure. The first gate structure includes a first gate, a first hard mask disposed on the first gate and a first spacer surrounding the first gate and the first hard mask, wherein the second gate structure includes a second gate, a second hard mask disposed on the second gate and a second spacer surrounding the second gate and the second hard mask. Later, the first spacer surrounding the first hard mask and the second spacer surrounding the second hard mask are removed. After that, a dielectric layer is formed to cover the first hard mask and the second hard mask. Finally, the second dielectric layer, the first mask layer and the second mask layer are removed.

16 Claims, 5 Drawing Sheets

METHOD OF REMOVING A HARD MASK ON A GATE

BACKGROUND OF THE INVENTION

1. Field of the Invention

The present invention relates to a method of removing hard masks on gates, and more particularly, to a method of uniformly removing hard masks on gates.

2. Description of the Prior Art

The performance of an electrical device is affected by the size of various features in the device, as well as the device switching speed and power consumption. As semiconductor devices continue to decrease in size, there is a desire to replace a conventional polysilicon gate electrode with a metal gate electrode to further improve device performance. There are challenges, however, to implementing such features and processes in conventional fabrication.

Before the polysilicon gate electrode can be replaced, a cap layer on top of the polysilicon gate electrode must be removed. Differences in topography of the substrate or differences in the pattern densities may cause the cap layer to be removed unevenly, so that some polysilicon gate electrodes are exposed while others are still covered by the cap layer. The exposed polysilicon gate electrodes will have a lower height than the polysilicon gate electrodes still covered by the cap layer, making them susceptible to damage from subsequent processes. Furthermore, the different heights of the polysilicon gate electrodes will cause the metal gate electrodes formed afterwards to have different heights.

SUMMARY OF THE INVENTION

According to a preferred embodiment of the present invention, a first gate structure and a second gate structure are formed, wherein the first gate structure includes a first gate, a first hard mask disposed on the first gate and a first spacer surrounding the first gate and the first hard mask, and wherein the second gate structure includes a second gate, a second hard mask disposed on the second gate and a second spacer surrounding the second gate and the second hard mask, a second top surface of the second hard mask being higher than a first top surface of the first hard mask. Later, a first dielectric layer is formed to entirely cover the first gate structure and the second gate structure. After that, the first dielectric layer is partly removed to expose the first spacer surrounding the first hard mask and the second spacer surrounding the second hard mask. Subsequently, the first spacer surrounding the first hard mask and the second spacer surrounding the second hard mask are removed to expose the first hard mask and the second hard mask. Later, a second dielectric layer are formed to cover the first hard mask and the second hard mask, wherein the second dielectric layer, the first hard mask and the second hard mask have the same removal rate. Finally, the second dielectric layer, the first mask layer and the second mask layer are removed.

These and other objectives of the present invention will no doubt become obvious to those of ordinary skill in the art after reading the following detailed description of the preferred embodiment that is illustrated in the various figures and drawings.

DETAILED DESCRIPTION

FIG. 1 to FIG. 8 depict schematically a method of removing a hard mask on a gate according to a preferred embodiment of the present invention.

Figure 1:
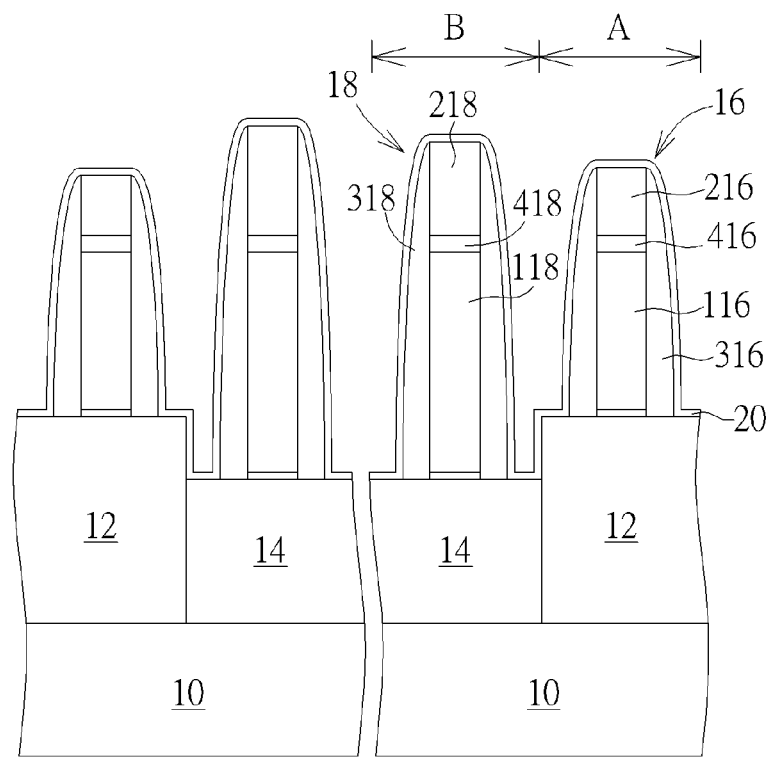
FIG. 1 to FIG. 8 depict schematically a method of removing a hard mask on a gate according to a preferred embodiment of the present invention.

As shown in FIG. 1, a substrate 10 is provided. The substrate 10 is divided into a first region A and a second region B. The first region A may include a first fin or a first STI and the second region B may include a second fin or a second STI. FIG. 1 takes the first region A including a first fin 12 and the second region B including a second STI 14 as an example. The first fin 12 protrudes from the second STI 14. A first gate structure 16 is formed on the substrate 10 within the first region A. A second gate structure 18 is formed on the substrate 10 within the second region B. In this embodiment, only two gate structures are formed; however, there can be more than two gate structures formed within the first region A or the second region B. The first gate structure 16 includes a first gate 116, a first hard mask 216 disposed on the first gate 116 and a first spacer 316 surrounding the first gate 116 and the first hard mask 216. The second gate structure 18 includes a second gate 118, a second hard mask 218 disposed on the second gate 118 and a second spacer 318 surrounding the second gate 118 and the second hard mask 218. The first mask 216 and the second mask 218 are both preferably silicon oxide. The first gate 116 and the second gate 118 may serve as dummy gates, and the first gate 116 and the second gate 118 are both preferably polysilicon. Furthermore, the first gate structure 16 includes a first protective layer 416 disposed between the first gate 116 and the first hard mask 216. The second gate structure 18 further includes a second protective layer 418 disposed between the second gate 118 and the second hard mask 218.

A top surface of the first protective layer 416 and a top surface of the second protective layer 418 are at the same horizontal level. A top surface of the second hard mask 218 and a top surface of the first hard mask 216 are preferably at different horizontal levels. For example, in this embodiment, the top surface of the second hard mask 218 is higher than the top surface of the first hard mask 216. In detail, a thickness of the second hard mask 218 is greater than a thickness of the first hard mask 216. The first spacer 316, the second spacer 318, the first protective layer 416 and the second protective layer 418 are preferably nitride-containing materials such as silicon nitride, silicon carbonitride or silicon oxycarbonitride. Later, an etching stop layer 20 is conformally formed on the first gate structure 16, the second gate structure 18 and the substrate 10. The etching stop layer 20 may be made of nitride-containing materials such as silicon nitride, silicon carbonitride or silicon oxycarbonitride.

Figure 2:
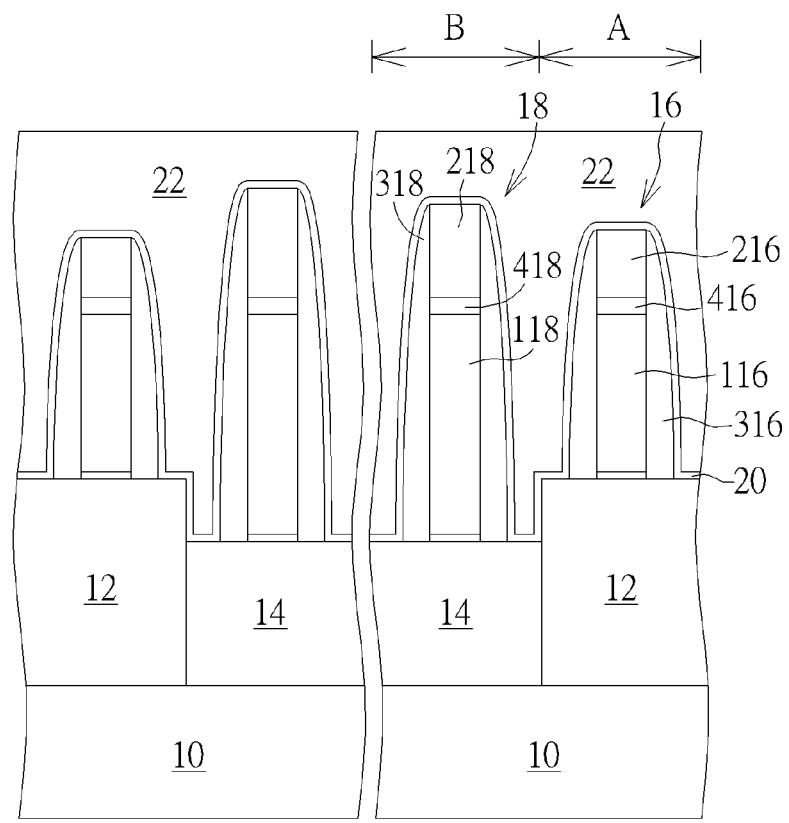
Figure 3:
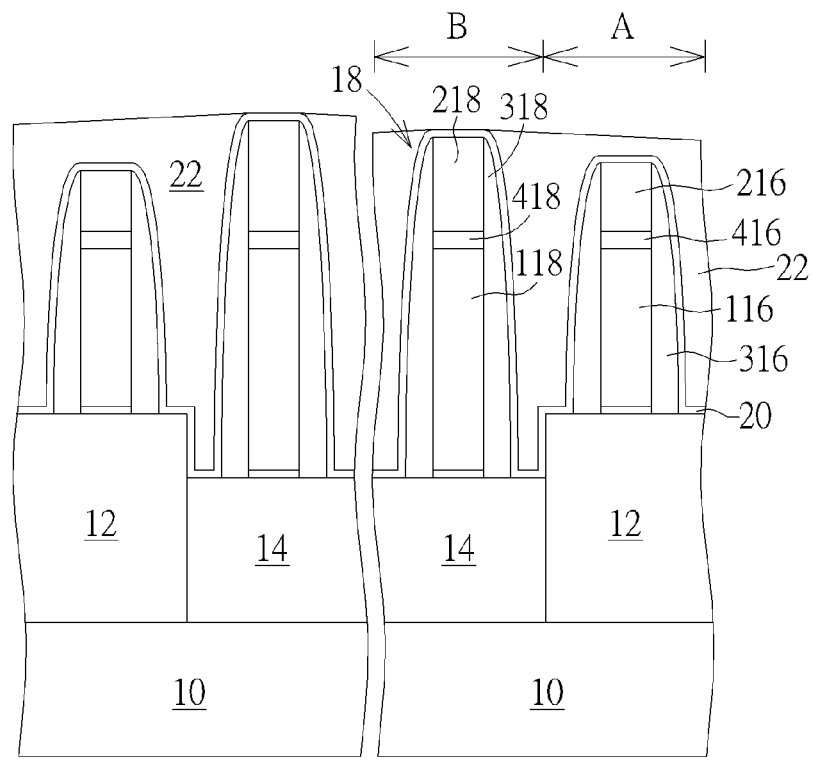

As shown in FIG. 2, a first dielectric layer 22 is formed to cover the etching stop layer 20, the first gate structure 16 and the second gate structure 18. The first dielectric layer 22 is preferably silicon oxide. As shown in FIG. 3, the first dielectric layer 22 is planarized by taking the etching stop layer 20 as a mask to make part of the first dielectric layer 22 stop on the etching stop layer 20. The first dielectric layer 22 can be planarized by a chemical mechanical polish process. Because the top surface of the second hard mask 218 is higher than the top surface of the first hard mask 216, the etching stop layer 20 on the second hard mask 218 should be higher than the etching stop layer 20 on the first hard mask 216. During the planarization process, the etching stop layer 20 on the second hard mask 218 should be exposed first. Then, the planarization process is stopped. At this point, the etching stop layer 20 on the first hard mask 216 can be optionally exposed. In other words, the dielectric layer 22 within the first region A may optionally stop on the etching stop layer 20 on the first gate structure 16. In other way, the first dielectric layer 22 within the first region A may still be higher than the etching stop layer 20 after the planarization process. At this point, the top surface of the first dielectric layer 22 declines from the second region B to the first region A, meaning that the top surface of first dielectric layer 22 within the second region B is higher than the top surface of the first dielectric layer 22 within the first region A.

Figure 4:
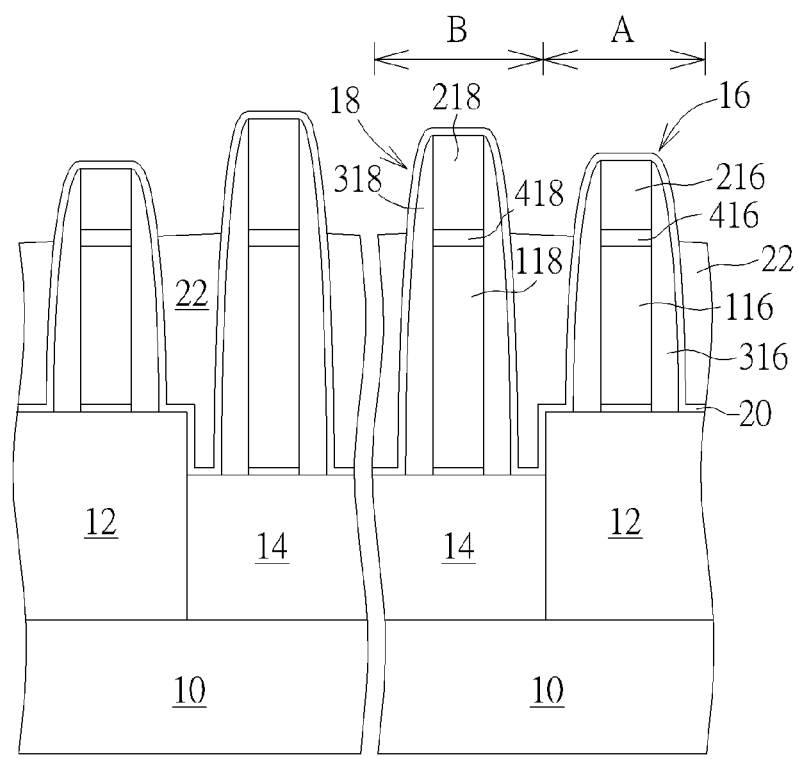

As illustrated in FIG. 4, the first dielectric layer 22 is partly removed to expose the first spacer 316 surrounding the first hard mask 216 and the second spacer 318 surrounding the second hard mask 218. After partly removing the first dielectric layer 22, the top surface of the first dielectric layer 22 within the first region A is not lower than the first protective layer 416 and the top surface of the first dielectric layer 22 within the second region B is not lower than the second protective layer 418. At this step, the top surface of the first dielectric layer 22 still declines from the second region B to the first region A. The first dielectric layer 22 in FIG. 4 may be removed by a SiCoNi™ process which is a remote plasma assisted dry etch process involving the simultaneous exposure of the first dielectric layer 22 to nitrogen trifluoride and ammonia.

Figure 5:
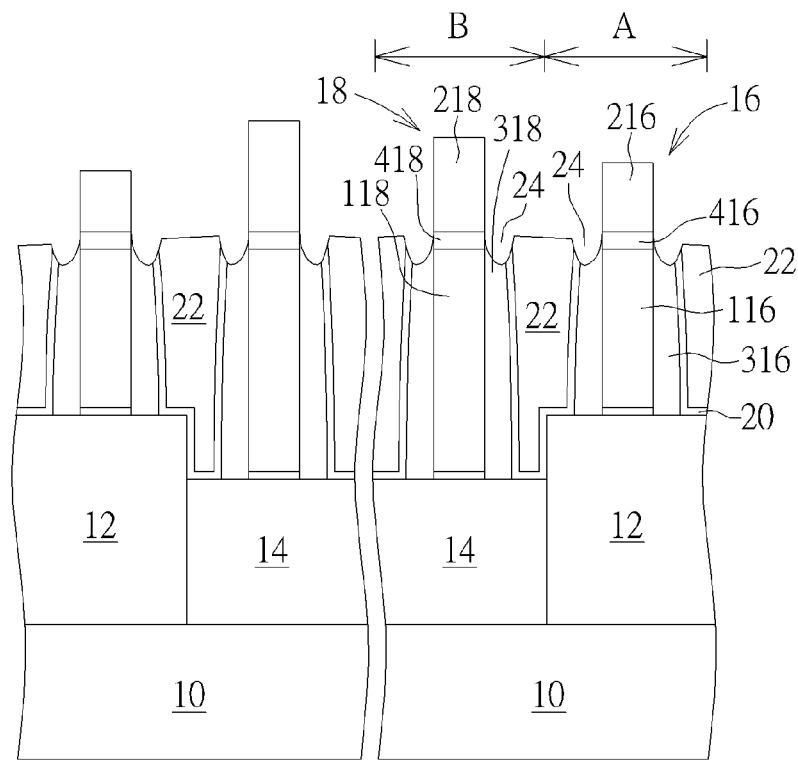

As shown in FIG. 5, the first spacer 316 surrounding the first hard mask 216 and the second spacer 318 surrounding the second hard mask 218 are removed to expose the first hard mask 216 and the second hard mask 218. The etching stop layer 20 on the first spacer 316 surrounding the first hard mask 216 and the second spacer 318 surrounding the second hard mask 218 are also removed. The first spacer 316, the second spacer 318 and the etching stop layer 20 in this step can be removed by an etching process. The first spacer 316 surrounding the first protective layer 416 may also be removed to make the remaining first spacer 316 lower than the first protective layer 416. The second spacer 318 surrounding the second protective layer 418 may also be removed to make the remaining second spacer 318 lower than the second protective layer 418. However, the first gate 116 is still encapsulated by the first protective layer 416, part of the first spacer 316 after the first spacer 316 surrounding the first hard mask 216 and the second spacer 318 surrounding the second hard mask 218 are removed. Similarly, the second gate 118 is still encapsulated by the second protective layer 418, part of the second spacer 318 after the first spacer 316 surrounding the first hard mask 216 and the second spacer 318 surrounding the second hard mask 218 are removed.

Since the top surface of the first dielectric layer 22 is not lower than the first protective layer 416 and the second protective layer 418, the top surface of the first dielectric layer 22 is higher than the remaining first spacer 316 and the remaining second spacer 318. Therefore, the remaining first spacer 316 and the remaining second spacer 318 consist of recesses 24 with respect to the first dielectric layer 22.

Figure 6:
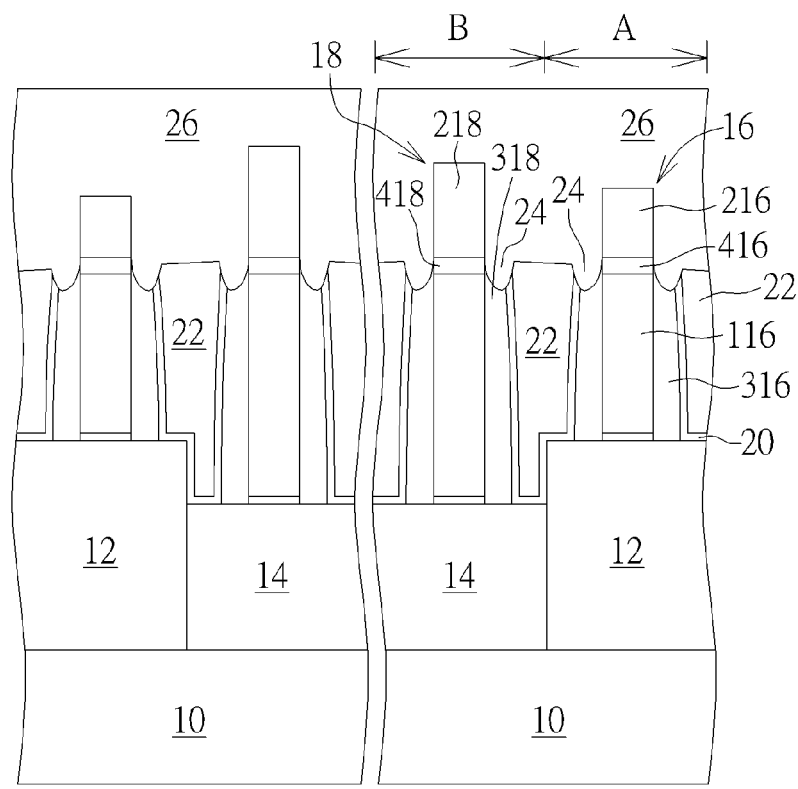
Figure 7:
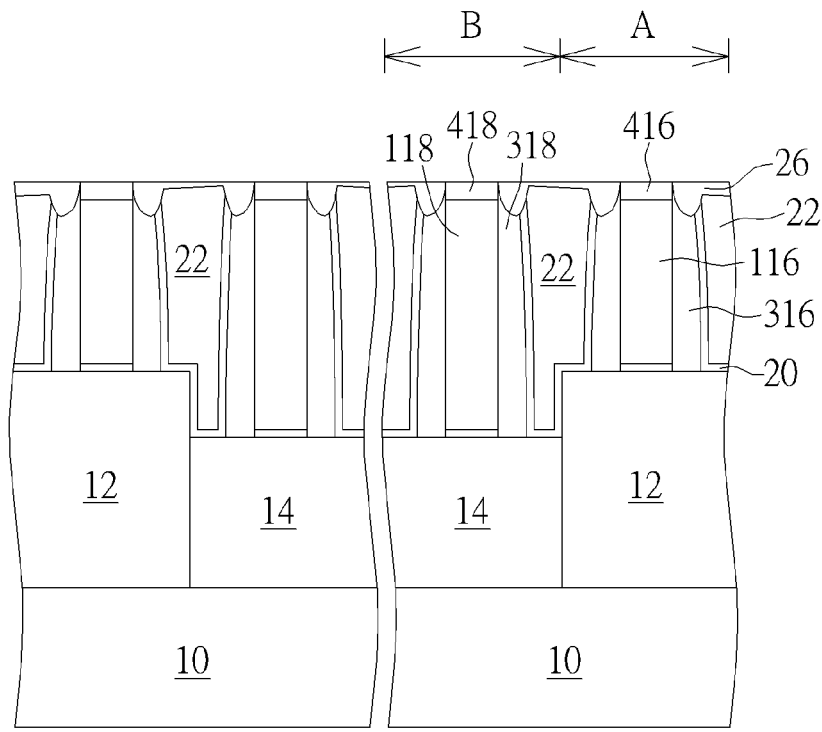

As shown in FIG. 6, a second dielectric layer 26 is formed to cover the first hard mask 216, the second hard mask 218 and fill in the recesses 24. A top surface of the second dielectric layer 26 within the first region A and the second region B are at the same horizontal level. Moreover, the second dielectric layer 26, the first hard mask 216 and the second hard mask 218 have the same removal rate. For example, the second dielectric layer 26, the first hard mask 216 and the second hard mask 218 have the same removal rate during a chemical mechanical polish process. Preferably, the first hard mask 216 and the second hard mask 218 are made of the same material such as silicon oxide. The second dielectric layer 26 can be formed by a high-density plasma deposition process. As shown in FIG. 7, the second dielectric layer 26, the first mask layer 216 and the second mask layer 218 are simultaneously removed entirely within the same step to expose the first protective layer 416 and the second protective layer 418. Because the second dielectric layer 26, the first hard mask 216 and the second hard mask 218 have the same removal rate, they can be removed uniformly by a chemical mechanical polish process. After the chemical mechanical polish process, the first protective layer 416 still covers the first gate 116, and the second protective layer 418 still covers the second gate 118. In detail, the first gate 116 is encapsulated by the first spacer 316 and the first protective layer 416. The second gate 118 is encapsulated by the second spacer 318 and the second protective layer 418. Later, subsequent processes such as an implantation process can be performed.

Figure 8:
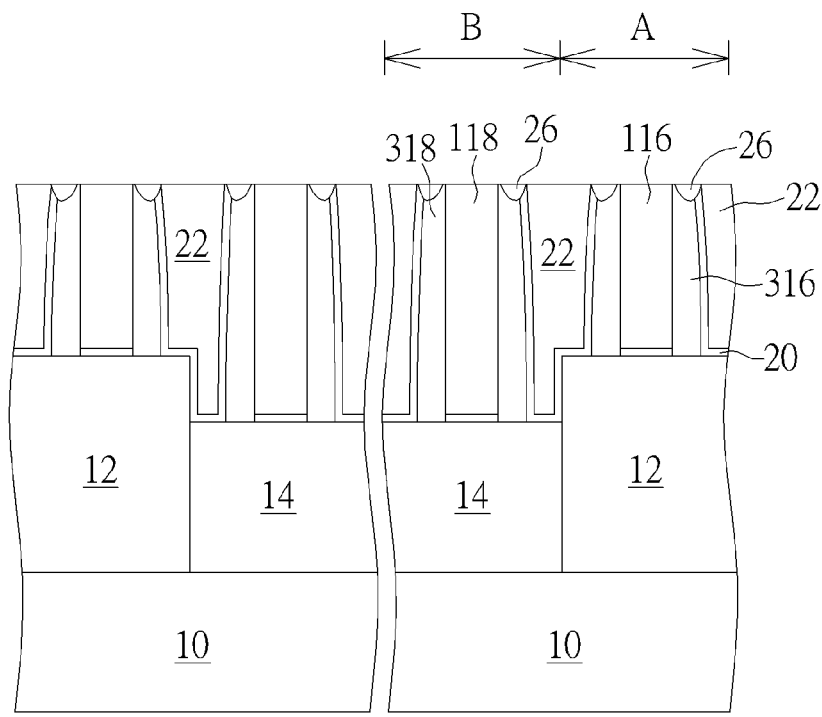
Figure 9:
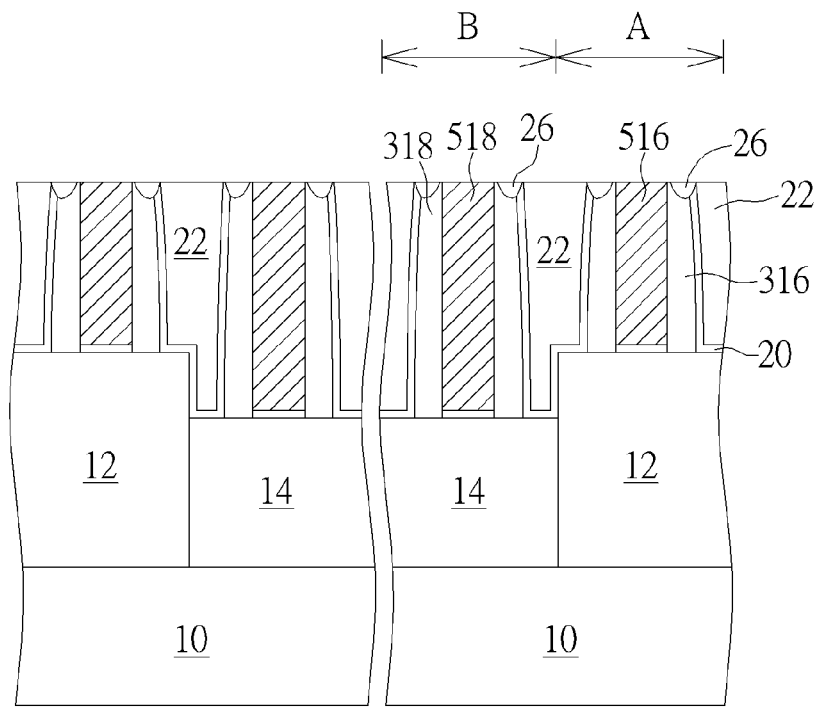
FIG. 9 depicts schematically a method of forming metal gates according to a preferred embodiment of the present invention.

As shown in FIG. 8, the first protective layer 416 and the second protective layer 418 are removed to expose the first gate 116 and the second gate 118. The first protective layer 416 and the second protective layer 418 are preferably removed by a chemical mechanical polish process. FIG. 9 depicts schematically a method of forming metal gates according to a preferred embodiment of the present invention. FIG. 9 continues from FIG. 8. As shown in FIG. 9, the first gate 116 and the second gate 118 are removed and replaced by a first metal gate 516 and a second metal gate 518, respectively.

Figure 10:
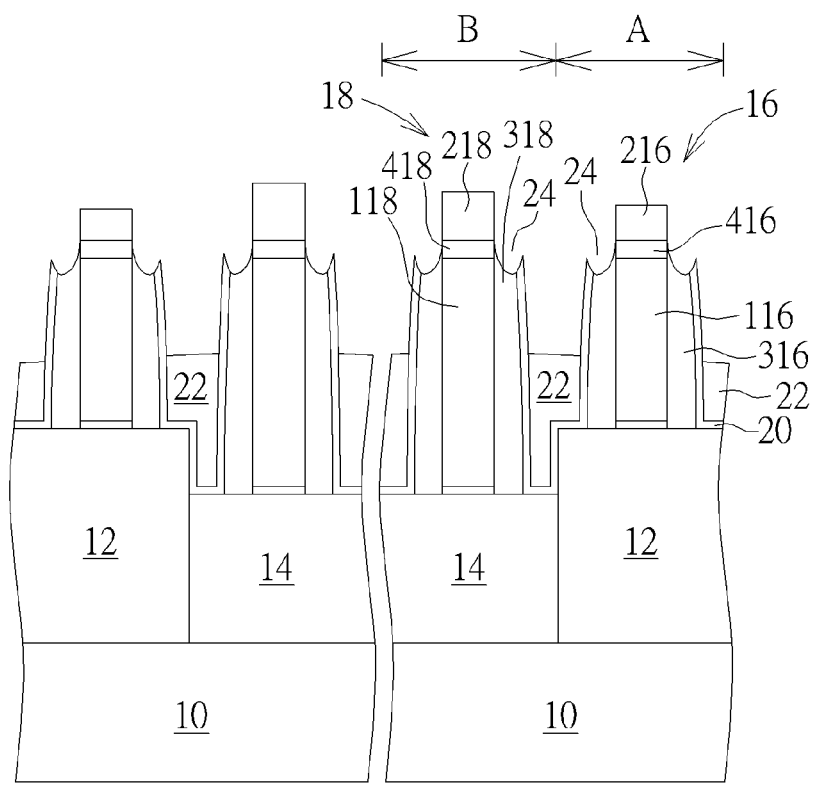
FIG. 10 depicts schematically a method of removing a hard mask on a gate according to another preferred embodiment of the present invention.

FIG. 10 depicts schematically a method of removing a hard mask on a gate according to another preferred embodiment of the present invention. Please refer to FIG. 10. According to another preferred embodiment of the present invention, after the first spacer 316 surrounding the first hard mask 216 and the second spacer 318 surrounding the second hard mask 218 are removed in FIG. 5, and before the second dielectric layer 26 is formed in FIG. 6, the first dielectric layer 22 can be further removed to make the top surface of the first dielectric layer 22 lower than the first protective layer 416 and the second protective layer 418. The removing method can be a SiCoNi™ process or a wet etching process. But there is still some first dielectric layer 22 remained on the first fin 12 and the second STI 14. Thereafter, the second dielectric layer 26 can be formed to cover the first dielectric layer 22. The subsequent processes are the same as those illustrated in FIG. 7 to FIG. 9; therefore is omitted here.

There are many factors to be considered in order to uniformly remove the hard masks on different gate structures. First, according to a conventional method, the hard masks and the spacers are removed by an etching process. The etching rates of the spacers and the hard masks are different, however, because the spacers and the hard masks are made of different materials. Furthermore, the gate structures are disposed on regions having different topography or having different pattern densities, which means the mask layers on different gate structures may have different heights. When the hard masks and spacers on different gate structures are removed by the etching process, the mask layers on different gate structures will not be removed to the same thickness. Some hard masks are removed entirely, with even the protective layers under the hard masks also being removed while other hard masks are only partly removed. The non-uniform removal of the hard masks causes problems in subsequent process.

According to the method of the present invention, the first spacer 316 and the second spacer 318 respectively on the first hard mask 216 and second hard mask 218 are removed first. Then, a second dielectric layer 26 which has the same material as the first hard mask 216 and the second hard mask 218 is formed to cover the first hard mask 216 and the second hard mask 218. Later, the first hard mask 216 and the second hard mask 218 and the second dielectric layer 26 can be removed by a chemical mechanical polish process at a same removal rate, so the first hard mask 216 and the second hard mask 218 on different gate structures can be removed uniformly. The first protective layer 416 and the second protective layer 418 respectively under the first hard mask 216 and the second hard mask 218 will therefore remain after the hard masks first hard mask 216 and the second hard mask 218 have been removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of removing a hard mask on a gate, comprising:
    forming a first gate structure and a second gate structure, wherein the first gate structure comprises a first gate, a first hard mask disposed on the first gate and a first spacer surrounding the first gate and the first hard mask, and wherein the second gate structure comprises a second gate, a second hard mask disposed on the second gate and a second spacer surrounding the second gate and the second hard mask, a second top surface of the second hard mask being higher than a first top surface of the first hard mask;
    forming a first dielectric layer entirely covering the first gate structure and the second gate structure;
    removing the first dielectric layer partly to expose the first spacer surrounding the first hard mask and the second spacer surrounding the second hard mask;
    removing the first spacer surrounding the first hard mask and the second spacer surrounding the second hard mask to expose the first hard mask and the second hard mask;
    forming a second dielectric layer covering the first hard mask and the second hard mask, wherein the second dielectric layer, the first hard mask and the second hard mask have the same removal rate; and
    removing the second dielectric layer, the first mask layer and the second mask layer.

2. The method of removing a hard mask on a gate of claim 1, wherein the first gate structure is disposed within a first region of a substrate, and the second gate structure is disposed within a second region of the substrate.

3. The method of removing a hard mask on a gate of claim 2, wherein the first region comprises a first fin or a first STI and the second region comprises a second fin or a second STI.

4. The method of removing a hard mask on a gate of claim 2, further comprising before forming the first dielectric layer, forming an etching stop layer conformally covering the first gate structure and the second gate structure.

5. The method of removing a hard mask on a gate of claim 4, wherein the steps of removing the first dielectric layer partly comprise:
    chemical mechanical polishing the first dielectric layer by taking the etching stop layer as a stop layer to make a top surface of the first dielectric layer within the second region be higher than a top surface of the first dielectric layer within the first region; and
    after the chemical mechanical polishing the first dielectric layer, removing the first dielectric layer to expose the first spacer surrounding the first hard mask and the second spacer surrounding the second hard mask.

6. The method of removing a hard mask on a gate of claim 2, wherein the first gate structure further comprises a first protective layer disposed between the first gate and the first hard mask, and the second gate structure further comprises a second protective layer disposed between the second gate and the second hard mask.

7. The method of removing a hard mask on a gate of claim 6, wherein after removing the first dielectric layer partly, a top surface of the first dielectric layer within the first region is not lower than the first protective layer and a top surface of the first dielectric layer within the second region is not lower than the second protective layer.

8. The method of removing a hard mask on a gate of claim 6, wherein when the first spacer surrounding the first hard mask is removed, the first spacer lower than the first protective layer is also partly removed, and when the second spacer surrounding the second hard mask is removed, the second spacer lower than the second protective layer is also partly removed.

9. The method of removing a hard mask on a gate of claim 6, wherein after the second dielectric layer, the first mask layer and the second mask layer are removed, the first protective layer still covers the first gate, and the second protective layer still covers the second gate.

10. The method of removing a hard mask on a gate of claim 6, wherein a top surface of the first protective layer and a top surface of the second protective layer are at the same horizontal level.

11. The method of removing a hard mask on a gate of claim 6, wherein after removing the first dielectric layer partly, a top surface of the first dielectric layer within the first region is lower than the first protective layer and a top surface of the first dielectric layer within the second region is lower than the second protective layer.

12. The method of removing a hard mask on a gate of claim 1, wherein the second dielectric layer, the first hard mask and the second hard mask are made of the same material.

13. The method of removing a hard mask on a gate of claim 12, wherein the second dielectric layer, the first hard mask and the second hard mask are made of silicon oxide.

14. The method of removing a hard mask on a gate of claim 1, wherein the second dielectric layer, the first mask layer and the second mask layer are removed by a chemical mechanical polish process.

15. The method of removing a hard mask on a gate of claim 1, wherein the first gate and the second gate are made of polysilicon and the first spacer and the second spacer are made of silicon nitride.

16. The method of removing a hard mask on a gate of claim 1, wherein the second dielectric layer, the first hard mask and the second hard mask have the same removal rate during a chemical mechanical polish process.

* * * * *